US006975751B2

(12) United States Patent
Pauly et al.

(10) Patent No.: US 6,975,751 B2
(45) Date of Patent: Dec. 13, 2005

(54) METHOD AND APPARATUS FOR RECONSTRUCTION OF NON-UNIFORMLY SAMPLED DATA

(75) Inventors: John Mark Pauly, Redwood City, CA (US); Juan Manuel Santos, Stanford, CA (US); Graham Arnold Wright, Toronto (CA)

(73) Assignees: The Board of Trustees of the Leland Stanford Junior University, Palo Alto, CA (US); GE Medical Systems Global Technology Company, LLC, Waukesha, WI (US)

( * ) Notice: Subject to any disclaimer, the term of this patent is extended or adjusted under 35 U.S.C. 154(b) by 638 days.

(21) Appl. No.: 10/147,708

(22) Filed: May 17, 2002

(65) Prior Publication Data

US 2003/0215154 A1 Nov. 20, 2003

(51) Int. Cl.[7] .................................................. G06K 9/00
(52) U.S. Cl. ....................... 382/130; 382/131; 600/410; 600/425
(58) Field of Search ................................ 382/130, 131; 600/410, 425

(56) References Cited

U.S. PATENT DOCUMENTS

| | | | | |
|---|---|---|---|---|
| 5,343,542 A | * | 8/1994 | Kash et al. ................. | 385/31 |
| 5,402,067 A | | 3/1995 | Pauly et al. ............... | 324/307 |
| 5,485,086 A | | 1/1996 | Meyer et al. .............. | 324/307 |
| 5,877,629 A | | 3/1999 | King et al. ................ | 324/309 |
| 5,998,996 A | | 12/1999 | Bernstein et al. ........ | 324/309 |
| 6,025,715 A | | 2/2000 | King et al. ................ | 324/309 |
| 6,288,545 B1 | | 9/2001 | King et al. ................ | 324/318 |
| 2001/0038285 A1 | | 11/2001 | Zhu ........................... | 324/309 |
| 2003/0102864 A1 | * | 6/2003 | Welch et al. ............. | 324/307 |

FOREIGN PATENT DOCUMENTS

| | | | |
|---|---|---|---|
| WO | WO 99/53440 | 10/1999 | ............. G06T/3/40 |
| WO | WO 9953440 A2 * | 10/1999 | ............. G06T/3/40 |

OTHER PUBLICATIONS

MR Fluoroscopy: Technical Feasibility, Stephen J. Riederer, Talin Tasciyan, Farhad Farzaneh, James N. Lee, Ronald C. Wright, and Robert J. Herfkens, Magnetic Resonance in Medicine 8, pp. 1–15, 1988.

"A Fast Sinc Function Gridding Algorithm for Fourier Inversion in Computer Tomography", J. D. O'Sullivan, IEEE Transactions on Medical Imaging, vol. MI–4, No. 4, pp. 200–207, Dec. 1985.

"Selection of a Convolution Function for Fourier Inversion Using Gridding" John I. Jackson, Craig H. Meyer, Dwight G. Nishimura, and Albert Macovski, IEEE Transactions on Medical Imaging, vol. 10, No. 3, pp. 473–478, Sep. 1991.

(Continued)

Primary Examiner—Andrew W. Johns
Assistant Examiner—O'Neal R. Mistry
(74) Attorney, Agent, or Firm—Cantor Colburn LLP

(57) ABSTRACT

A method for reconstructing non-uniformly sampled data to create an image includes: receiving a new partial data set, the new partial data set including a vector of non-uniformly sampled data at k-space positions; subtracting an old partial data set at the same k-space positions from the new partial data set to create a difference vector; gridding the difference vector to create a difference matrix; adding the difference matrix to a frame of previously gridded data to create a new frame; and transforming the new frame to create the image. In one embodiment, gridding includes constructing a gridding table for a data point in a complete data set, and convolving a data point in the difference vector with the gridding table. In another embodiment at least one of a grid size and a first parameter of the window function is optimized using input parameters for at least one of aliasing energy and computation time.

28 Claims, 7 Drawing Sheets

OTHER PUBLICATIONS

"A Rapid Look–Up Table Method for Reconstructing MR Images from Arbitrary K–Space Trajectories", Brian Dale, M. Wendt and J. L. Duerk, IEEE Transactions on Medical Imaging, vol. 20, No. 3, pp. 207–217, Mar. 2001.

FFTW: An Adaptive Software Architecture for the EFTW, "The Fastest Fourier Transform in the West", Matteo Frigo, Steven G. Johnson, Massachusetts Institute of Technology, Sep. 11, 1997.

"An Introduction to NMR Imaging: From the Bloch Equation to the Imaging Equation", Waldo S. Hinshaw and Arnold H. Lent, Proceedings of the IEEE, vol. 71, No. 3, pp. 338–350, Mar. 1983.

"Fast Spiral Coronary Artery Imaging", Craig H. Meyer, Bob S. Hu, Dwight G. Nishimura and Albert Macovski, Magnetic Resonance In Medicine 28, 202–213, 1992.

"Real–Time Interactive MRI on a Conventional Scanner", Adam B. Kerr, John M. Pauly, Bob S. Hu, King C. Li, Christopher J. Hardy, Craig H. Meyer, Albert Macovski, Dwight G. Nishimura, Magnetic Resonance Systems Research Laboratory, pp. 355–367, 1997.

"Simple Equation for Optimal Gridding Parameters", F.T.A. W. Wajer, E. Woudenberg, R. de Beer, M. Fuderer, A.F. Mehlkropf, D. Van Ormondt, pp. 663, Proc. Intl. Soc. Magn. Reson. Med. 7 (1999).

* cited by examiner

FIG. 4A
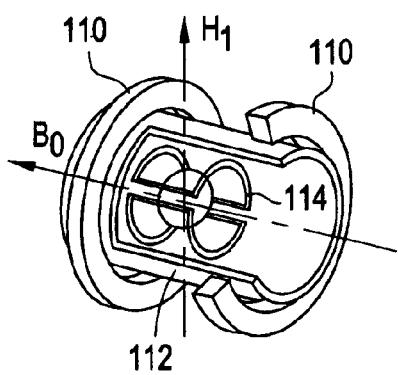
FIG. 4B    FIG. 4C    FIG. 4D
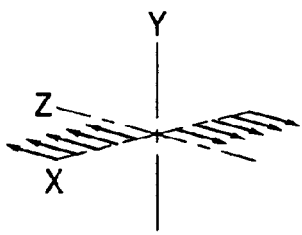 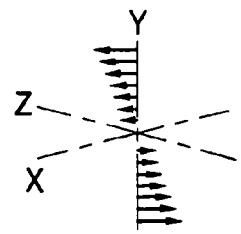 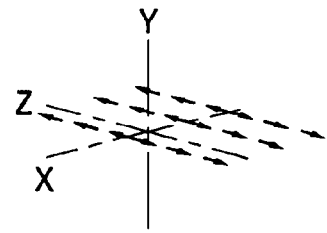

METHOD AND APPARATUS FOR RECONSTRUCTION OF NON-UNIFORMLY SAMPLED DATA

BACKGROUND OF THE INVENTION

The present invention relates to signal data processing and in particular to efficient reconstruction of non-uniformly sampled data for medical imaging.

The Fourier Transform (FT) is one of the most important signal processing techniques in use today. In particular, it finds a number of uses in medical imaging, including reconstruction of MRI images and Fourier reconstruction of CT images. In MRI applications, the FT is used to convert the acquired data into an image. The quality and accuracy of the image is of utmost importance in medical examinations.

The Fast Fourier Transform (FFT) is an efficient implementation of the FT, which is designed for data that is uniformly sampled in a grid having sides which are typically powers of two. In addition to the FFT, there are other signal and image processing techniques that require the input data to be sampled to a specific grid, for example, backprojection reconstruction in computed tomography (CT) or magnetic resonance imaging (MRI) and diffraction tomography.

In many real-world situations, the data is not uniformly sampled. In spiral MRI, for example, the non-uniform sampling is due to time varying magnetic gradients. Typically, allowing non-uniform sampling can significantly shorten MRI data acquisition time.

In MRI, data is acquired into a frequency domain space called k-space, which is the Fourier transform space of the image. An image is usually reconstructed from the k-space by applying an FFT to the data in the k-space. A major difference between MRI methods is how k-space is traversed to acquire the data. For example, in spiral MRI, data is acquired along a spiral trajectory in two-dimensional k-space, while in two-dimensional Fourier transform (2DFT) MRI, data is acquired along individual rows in k-space. In three-dimensional MRI, the k-space is three dimensional.

To allow signal and image processing techniques such as the FFT to be applied to non-uniformly spaced data points, the non-uniformly spaced data points can be interpolated onto a uniformly spaced grid, a process known as gridding. Gridding was originally introduced into medical imaging by O'Sullivan in "A Fast Sinc Function Gridding Algorithm for Fourier Inversion", *IEEE Trans. Med. Imaging*, MI-4:200–207, 1985 and by Jackson et. al in "Selection of A Convolution Function for Fourier Inversion using Gridding", in *IEEE Trans. Med. Imaging*, MI-10:473–478, 1991.

In the gridding algorithm presented by O'Sullivan, resampling (reconstruction) of data (in k-space) is applied as follows:

(a) Multiply the trajectory data by an appropriate density compensation function to compensate for the varying density of sampling in k-space.

(b) Convolve the density compensated trajectory data by an appropriate window function.

(c) Re-sample onto a uniformly spaced Cartesian grid by multiplying a comb function.

(d) Perform an FFT on the redistributed set of data points to get an image.

(e) Deconvolve the transformed data to remove apodization of the convolution kernel by dividing the image data by the transform of the window function.

For real time MRI imaging, e.g., dynamic imaging of the heart, an important requirement for the reconstruction process is that it has to be done fast enough to maintain the rate at which the data are acquired.

Various solutions have been applied to overcome the speed limitations of reconstruction processes. Some solutions have used special hardware or distributed computer systems. These solutions, however, are costly due to the special hardware required. Other solutions have minimized the number of computational steps allowed between sequential images. For example, a Kaiser-Bessel window may be used as the convolution kernel, rather than a sinc window, to reduce the computational complexity. However, for high speed applications such as real-time systems where images are acquired continuously, the Kaiser-Bessel convolution may itself be too computationally intensive.

Another important requirement for any reconstruction process is that it must provide an image of sufficient quality for use in medical diagnosis. For example, degradation of image quality may occur towards the edges of the generated image in the form of "cupping". Cupping is where the intensity profile is lower (or higher) at the center of the image than at its ends and wings is where there is an overrun of the signal beyond the ends of the image carrying portion of the image. One solution to such degradation is to interpolate onto a 2N×2N grid, rather than onto an N×N grid (oversampling). The result is then post-compensated and only the central N×N portion of the post-compensated result is persevered. Most of the artifacts are outside this central portion. While this method works well to improve image quality, this technique increases the number of points for the FFT, by a factor of four, which considerably increases the complexity of the computation.

Thus, there remains a need for a reconstruction process that provides an image of sufficient quality for use in medical diagnosis, while being fast enough to maintain the rate at which the data are acquired and minimize latency.

BRIEF DESCRIPTION OF THE INVENTION

The above deficiencies are overcome or alleviated by a method for reconstructing non-uniformly sampled data to create an image. The method includes: receiving a new partial data set, the new partial data set including a vector of non-uniformly sampled data at k-space positions; subtracting an old partial data set at the same k-space positions from the new partial data set to create a difference vector; gridding the difference vector to create a difference matrix; adding the difference matrix to a frame of previously gridded data to create a new frame; and transforming the new frame to create the image. In one embodiment, gridding includes constructing a gridding table for a data point in a complete data set, and convolving a data point in the difference vector with the gridding table. In another embodiment at least one of a grid size and a first parameter of the window function is optimized using input parameters for at least one of aliasing energy and computation time.

The above discussed and other features of the present invention will be appreciated and understood by those skilled in the art from the following detailed description and drawings.

BRIEF DESCRIPTION OF THE DRAWINGS

Referring to the exemplary drawings wherein like elements are numbered alike in the several Figures:

FIGS. 4A–4D illustrate the arrangement of conventional MRI apparatus and magnetic fields generated therein;

DETAILED DESCRIPTION OF THE INVENTION

Figure 1:
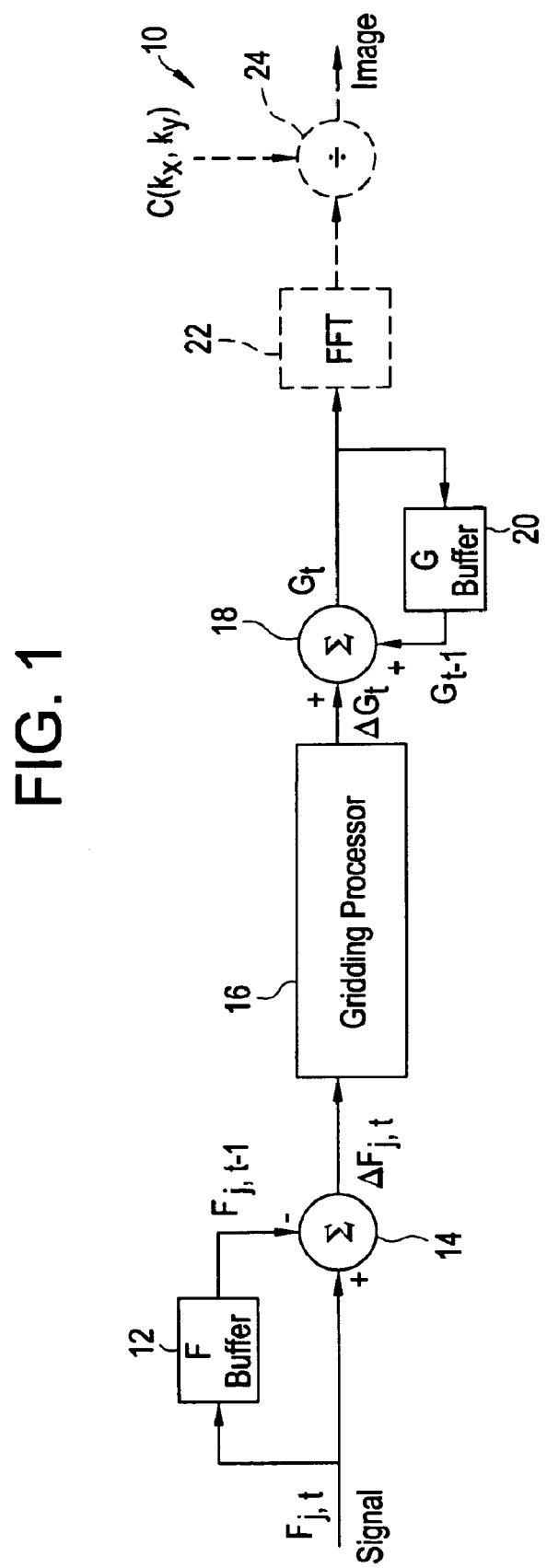
FIG. 1 is a schematic block diagram of an apparatus for reconstruction of non-uniformly sampled data.

Referring to FIG. 1, an apparatus for reconstruction of non-uniformly sampled data is shown generally at 10. Apparatus 10 can be implemented in hardware (e.g., as a circuit, a digital signal processor chip, an application specific integrated circuit, or the like), in machine-readable code for use with a computer (e.g., software, firmware, or the like), or in any combination thereof. As will be discussed in further detail hereinafter, apparatus 10 reconstructs each new frame, $G_t$, by first gridding the difference between a new partial data set $F_{j,t}$ at a set of k-space positions j from the present acquisition and an old partial data set $F_{j,(t-1)}$ at corresponding k-space positions j from a previous acquisition, to create a difference matrix $\Delta G_t$. The difference matrix $\Delta G_t$ is then added to a corresponding, previous frame of gridded data $G_{(t-1)}$ to acquire the new frame $G_t$. This method reduces the gridding time by a proportion of the number of shared acquisitions and the complete data set (i.e., the number of points in $F_j$ divided by the number of points in the complete data set F). As will also be discussed, the gridding process used by apparatus 10 may also employ grid parameter and grid size optimization techniques and a lookup table method. These methods further reduce gridding time.

In the embodiment of FIG. 1, apparatus 10 includes a data buffer device 12 and a summing device 14, which receives a partial data set $F_{j,t}$ for a present acquisition. Each partial data set $F_{j,t}$ includes a vector of data sampled using a non-uniform (non-rectilinear or non-Cartesian) k-space trajectory at a set of k-space positions j. Examples of non-uniform trajectories include, for example, spiral, radial, and rosette trajectories. Summing device 14 determines the difference between the partial data set for the present acquisition $F_{j,t}$ and a partial data set $F_{j,(t-1)}$ at a corresponding set of k-space positions j in a previous acquisition. Buffer device 12 stores the most recent data at all positions (F) for use in processing partial data sets for subsequent acquisitions. Buffer device 12 may include, for example, random-access memory, read/write memory (e.g., a computer hard drive), a queue, or any other device allowing the storage and retrieval of partial data sets.

The output of summing device 14 is the difference vector $\Delta F_{j,t}$, which is provided as input to a gridding processor 16. Gridding processor 16 receives the difference vector $\Delta F_{j,t}$ and interpolates the non-uniformly spaced data points onto a uniformly spaced grid, a process known as gridding. Preferably, the gridding process used by gridding processor 16 is that which is described herein with reference to FIG. 2; however, the gridding process used by gridding processor 16 may include any known gridding process. For example, gridding processor 16 may employ the method presented by O'Sullivan, supra, which includes:

(a) Multiplying the data by an appropriate density compensation function, to compensate for the varying density of sampling in k-space;

(b) Convolving the density compensated data by an appropriate window function, such as the Kaiser-Bessel function; and (c) Re-sampling onto a uniformly spaced rectilinear or Cartesian grid by multiplying a comb function, a regularly spaced bed-of-nails (Shah) function.

The output of the gridding processor 16 is the difference matrix $\Delta G_t$, which includes data from the difference vector $\Delta F_{j,t}$ gridded to regularly spaced rectilinear or Cartesian grid. The difference matrix is provided to a summing device 18, which sums the difference matrix $\Delta G_t$ with a frame of previously gridded data $G_{(t-1)}$, which is provided by buffer device 20. Buffer device 20 may include, for example, random-access memory, read/write memory (e.g., a computer hard drive), a queue, or any other device allowing the storage and retrieval of frames.

The output of summing device 20 is the new frame $G_t$, which is provided to a fast Fourier transform (FFT) device 22. The new frame $G_t$ is also provided as input to buffer device 20 for use in processing subsequent frames. FFT device 22 transforms the gridded k-space data in the frame $G_t$ into the desired image. The transformed image is then provided to de-apodization device 24, where the transformed image is divided by the Fourier transform (FT) of the convolution window function (convolution kernel) to remove apodization of the convolution kernel. It will be recognized that de-apodization may be unnecessary, depending on the window function was used in the gridding convolution (e.g., if a sinc function was used).

The method employed by apparatus 10 takes advantage of the fact that gridding convolution is a linear operation, and generates an image by sharing acquisitions between consecutive full frame acquisitions. Because the new frame is regridded using only the difference between the old data and the new data, the method employed by apparatus 10 reduces the gridding time by a proportion of the number of shared acquisitions and the complete data set.

Figure 2:
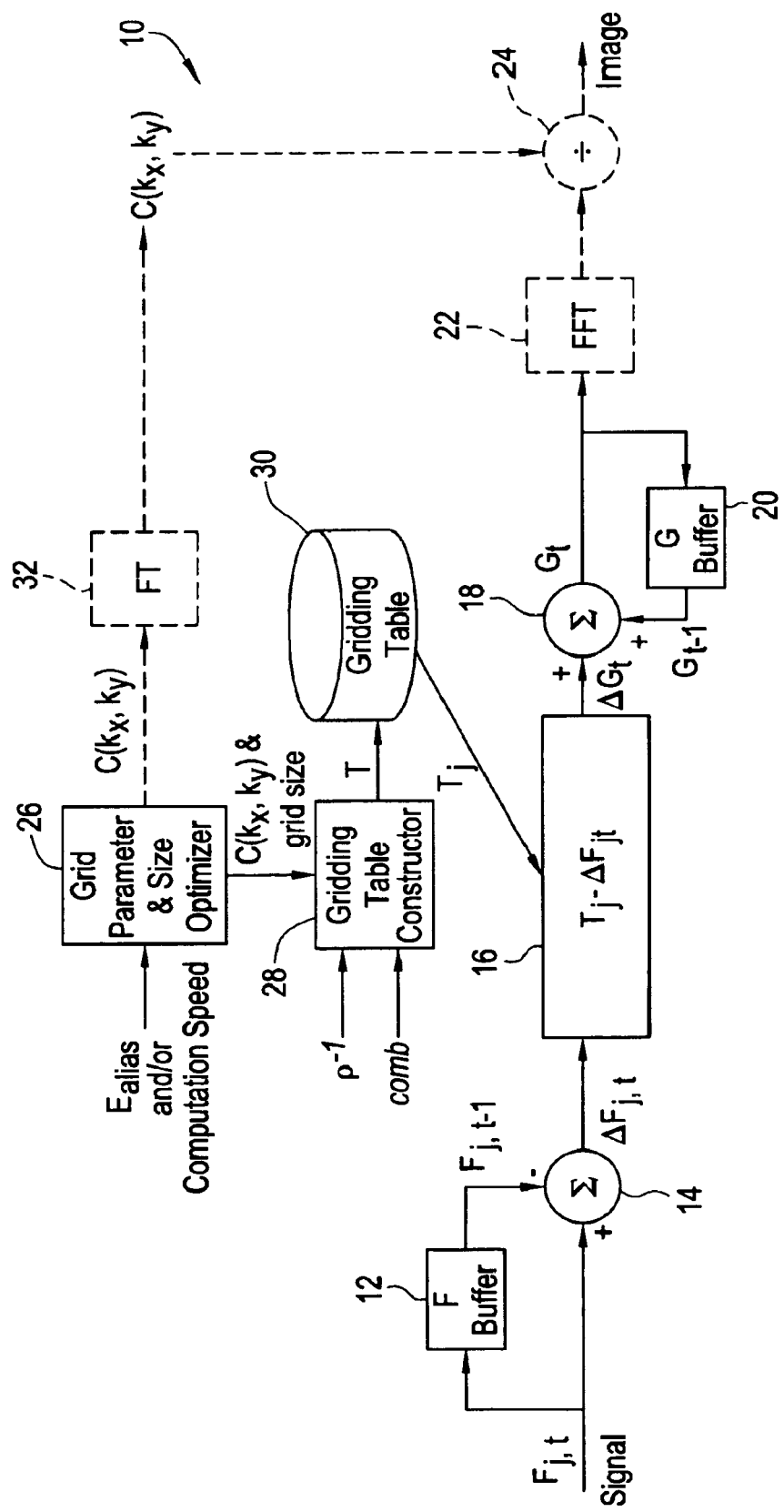
FIG. 2 is a schematic block diagram of the apparatus of FIG. 1 employing grid parameter and size optimization and a lookup table calculation method.

Referring to FIG. 2, gridding processor 16 is shown in further detail. In the embodiment of FIG. 2, gridding processor 16 includes a grid parameter and grid size optimizer 26, a gridding table constructor 28, and a gridding table storage device 30. Grid parameter and grid size optimizer 26 optimizes the parameters of the window function and the size of the grid used in the gridding process, based on image aliasing energy ($E_{alias}$) and/or calculation time constraints, where $E_{alias}$ is the amount of unwanted sidelobe energy that will alias into the image, and calculation time is the time apparatus 10 takes to reconstruct one or more images. As described by F. T. A. W. Wajer et al. in "Simple Equation for Optimal Gridding Parameters", *Proc. ISMRM*, 663, 1999, and by Jackson et al., supra, the parameters used in the window function and the grid size can be represented as functions of $E_{alias}$ and calculation time. Using these relationships, optimal values for the window function parameters and grid size can be determined for known $E_{alias}$ and calculation time constraints.

For example, the Kaiser-Bessel window may be used as the convolution kernel in the gridding process. The Kaiser-Bessel window can be represented as:

$$C(k_x,k_y)=C(k_x)\cdot C(k_y)$$

$$C(k) = \begin{cases} \frac{1}{W}I_0\left[\beta\sqrt{1-\left(\frac{2k}{W}\right)^2}\right], & \text{where } |k| \leq \frac{W}{2} \\ 0, & \text{otherwise} \end{cases}$$

where $I_0$ is a zero-order modified Bessel function of the first kind;

W is the width of the window;

$\beta$ is the shape (free) parameter; and k is the sampled locations in the frequency domain.

Figure 3:
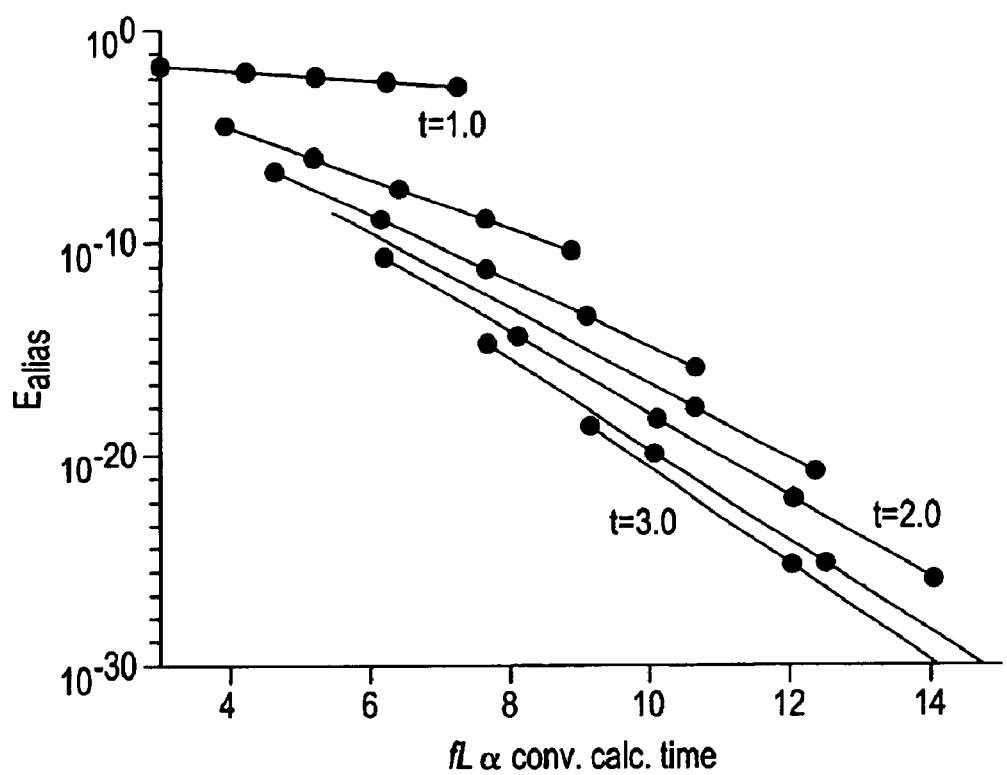
FIG. 3 is a surface depicting aliased energy of the Kaiser-Bessel window as a function of window and grid size.

As described by F. T. A. W. Wajer et al., supra, the calculation time is a function of W and a grid size factor, f, which is the ratio between the reconstructed grid size and the minimum grid size determined by the acquired field of view and resolution. In addition, $E_{alias}$ can be determined as a function of f and W, as shown in FIG. 3. Using the relationships calculation time=$f(f,W)$ and $E_{alias}=g(f,W)$, a range of acceptable values for f and W can be determined by applying the known $E_{alias}$ and calculation time constraints to these relationships. In this example, an optimal value of β can be determined from f and W, $$\beta_{optimum} = \left(f - \frac{1}{2}\right)\pi W$$

In one embodiment, a user of apparatus 10 would input an aliasing energy below some value which would be significantly below the expected noise level in the images. Grid parameter and grid size optimizer 26 would then calculate the fastest calculation time for the input aliasing energy. Alternatively, the user could set a minimum acceptable speed and see if the resulting noise (aliasing energy) is acceptable. The parameter and grid size optimizer 26 would determine the two parameters—grid size f and window width W—to address these constraints, and in the process determine the shape parameter β using f and W.

The output of parameter and grid size optimizer 26 is the optimized window function, $C(k_x, k_y)$, and the grid size f to be used in the gridding process. The optimized window function $C(k_x, k_y)$ is provided to a Fourier transform (FT) device 32, which provides the transform of the window function, $C(k_x, k_y)$, to the de-convolution device 24.

The optimized window function, $C(k_x, k_y)$ is also provided to the gridding table constructor 28 along with the grid size f. As described in Dale et al., "A Rapid Look-Up Table Method for Reconstructing MR Images from Arbitrary K-Space Trajectories", *IEEE T.Med.I*, 20:207–17, 2001, steps (a) through (c) of the O'Sullivan gridding algorithm, described above, can be replaced by a computationally efficient method that employs a pre-calculated filtering function so the gridding operation is reduced to a weighted sum of the sampled values at the grid locations. This allows the implementation of computationally intensive filters like Kaiser-Bessel without affecting the gridding performance while adding only a small latency for initial set-up.

The gridding table constructor 28 constructs a precalculated table of weights Tg(i) describing how each data point i in the complete set of k-space locations contributes to a small, rectilinearly sampled, k-space neighborhood. The gridding table is in the form:

$$Tg(i) = \begin{bmatrix} Tg(i, 0, 0) & \ldots & Tg(i, N-1, 0) \\ \vdots & \ddots & \vdots \\ Tg(i, 0, N-1) & \ldots & Tg(i, N-1, N-1) \end{bmatrix}$$

where $Tg(i, k_x, k_y) = (C(k_x, k_y)*(\rho^{-1}(k_x(i),k_y(i))\cdot\delta(k_x-k_x(i), k_y-k_y(i))))\cdot comb(k_x,k_y) i=0,1,\ldots,N-1$ and k(i) is the sampled location in frequency, N is the number of frequency samples, $C(k_x, k_y)$ is the optimized window function provided by grid parameter and size optimizer 26, $F_j(k_x(i), k_y(i))\cdot\delta(k_x-k_x(i), k_y-k_y(i))$ is the partial data set, $comb(k_x, k_y)$ is the comb function, which is an input to gridding table constructor 28, and $\rho^{-1}(k_x(i), k_y(i))$ is the density compensation function, which is an input to gridding table constructor 28.

The output of gridding table constructor 28 is the gridding table for each data point i to be sampled, each of which is stored in gridding table storage device 30.

The operation of gridding processor 16 is to retrieve the appropriate gridding table Tg(i) from storage device 30 and perform the operation:

$$\Delta G_i = \sum_{i=0}^{N-1} Tg_j(i) \cdot (F_{j,t}(k_x(i), k_y(i)) - F_{j,(t-1)}(k_x(i), k_y(i)))$$

where $$\Delta G_t = \begin{bmatrix} \Delta G_t(0, 0) & \ldots & \Delta G_t(N-1, 0) \\ \vdots & \ddots & \vdots \\ \Delta G_t(0, N-1) & \ldots & \Delta G_t(N-1, N-1) \end{bmatrix}$$

The output of gridding processor 16 is the difference matrix $\Delta G_t$, which is provided to FFT device 22. Because the optimal grid size f used in the gridding process may not have sides which are powers of two, it is preferred that a highly optimized algorithm, such as the FFTW (Fastest Fourier Transform in the West) algorithm, be used. Such algorithms provide a wider range of matrix sizes for which computation speed can be compared to power of two matrices. Using such a matrix provides an extra degree of freedom in the parameter design. The FFTW algorithm is described by Frigo and Johnson in "FFTW: An Adaptive Software Architecture for the FFT", *ICASSP Conference Proceedings*, vol. 3, pp. 1381–1384, 1998, which is incorporated by reference herein in its entirety.

The method employed by apparatus 10 provides adequate performance for real-time imaging using standard hardware. Scalability is achieved with parallel reconstruction processes for multi-coil acquisitions. The method allows for adaptive imaging as fundamental changes in the acquisition, like changing the k-space trajectory, can be handled by simply re-computing the lookup table. The combination of using lookup tables, partial reconstruction, proper choice of grid size and window width leads to high speed reconstruction without affecting image quality.

Referring now to FIGS. 4 through 7, an example of a medical imaging system employing the present invention is described. In this example, the medical imaging system is a Nuclear Magnetic Resonance (NMR) imaging, or MRI, system. It will be recognized, however, that the present invention may be implemented in any medical imaging system where reconstruction of non-uniformly sampled data is required. In FIG. 4A, a perspective view, partially in section, illustrates a coil apparatus in a Nuclear Magnetic Resonance (NMR) imaging system. FIGS. 4B–4D illustrate field gradients which can be produced in the apparatus of FIG. 4A. This apparatus is discussed by Hinshaw and Lent, "An Introduction to NMR Imaging: From the Bloch Equation to the Imaging Equation," *Proceedings of the IEEE*, Vol. 71, No. 3, March 1983 pp. 338–350. Briefly, the uniform static field $B_0$ is generated by the magnet comprising the coil pair 110. A gradient field G(x) is generated by a complex gradient coil set which can be wound on the cylinder 112. An RF field $B_1$ is generated by a saddle coil 114. A patient undergoing imaging would be positioned along the Z axis within the saddle coil 114.

In FIG. 4B an X gradient field is shown which is parallel to the static field $B_0$ and varies linearly with distance along the X axis but does not vary with distance along the Y or Z axes. FIGS. 4C and 4D are similar representations of the Y gradient and Z gradient fields, respectively.

Figure 5:
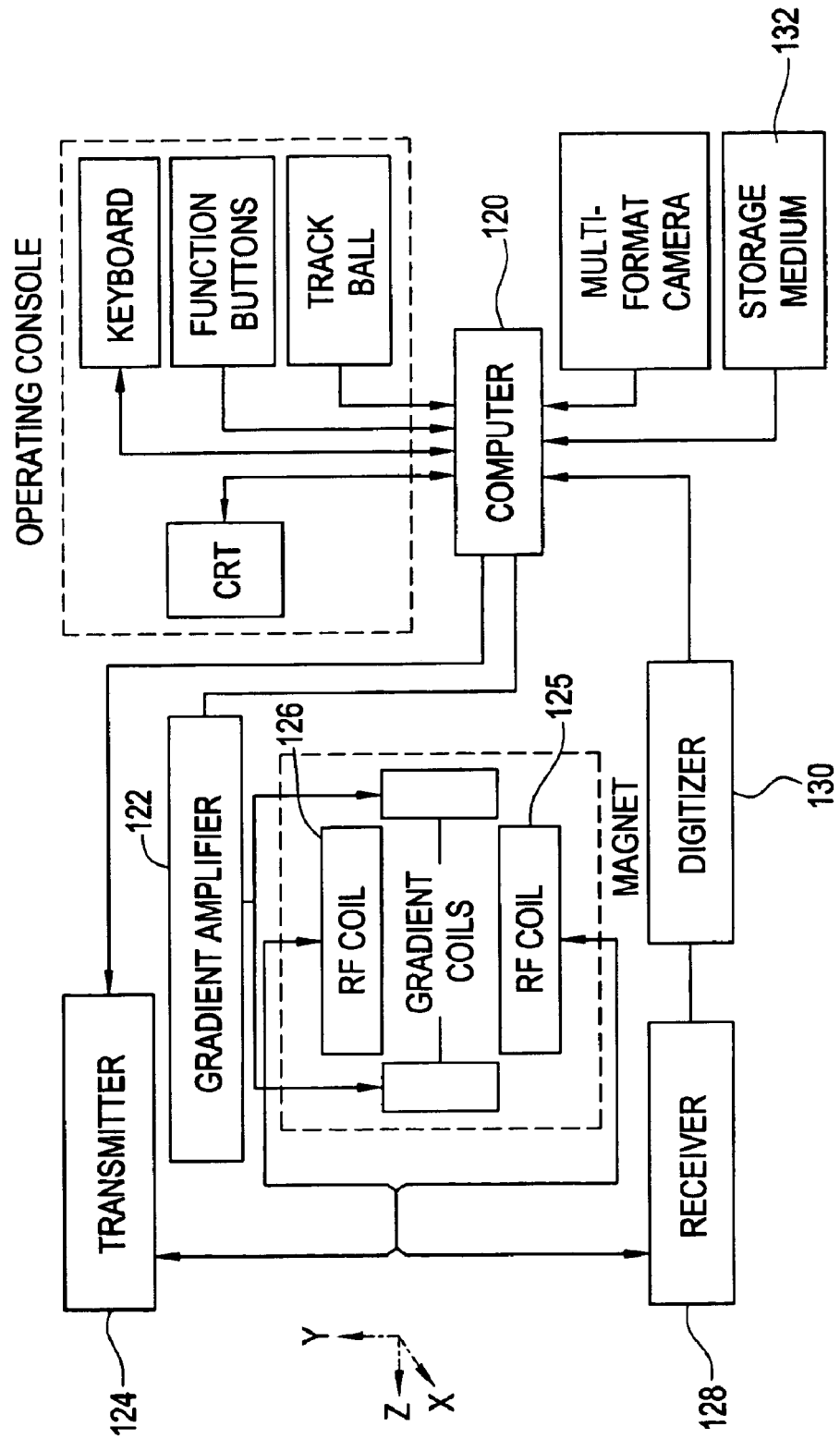
FIG. 5 is a functional block diagram of an MRI imaging system employing the apparatus of FIG. 2.

FIG. 5 is a functional block diagram of an imaging apparatus employing the method and apparatus 10 of the present invention. A computer 120 is programmed to control the operation of the NMR apparatus and process free induction decay (FID) signals detected therefrom to create an image. The gradient field is energized by a gradient amplifier 122, and the radio frequency (RF) coils for impressing an RF magnetic moment at the Larmor frequency are controlled by the transmitter 124 and the RF coils 126. After the selected nuclei have been tipped, the RF coils 126 are employed to detect the FID signal which is passed to the receiver 128 and thence through digitizer 130 for processing by computer 120. The apparatus 10, as shown in FIG. 1 or 2, for reconstruction of non-uniformly sampled data is implemented as machine readable code stored in storage medium 132. The machine readable code instructs computer 120 to perform the method of reconstruction described herein above.

Figure 6:
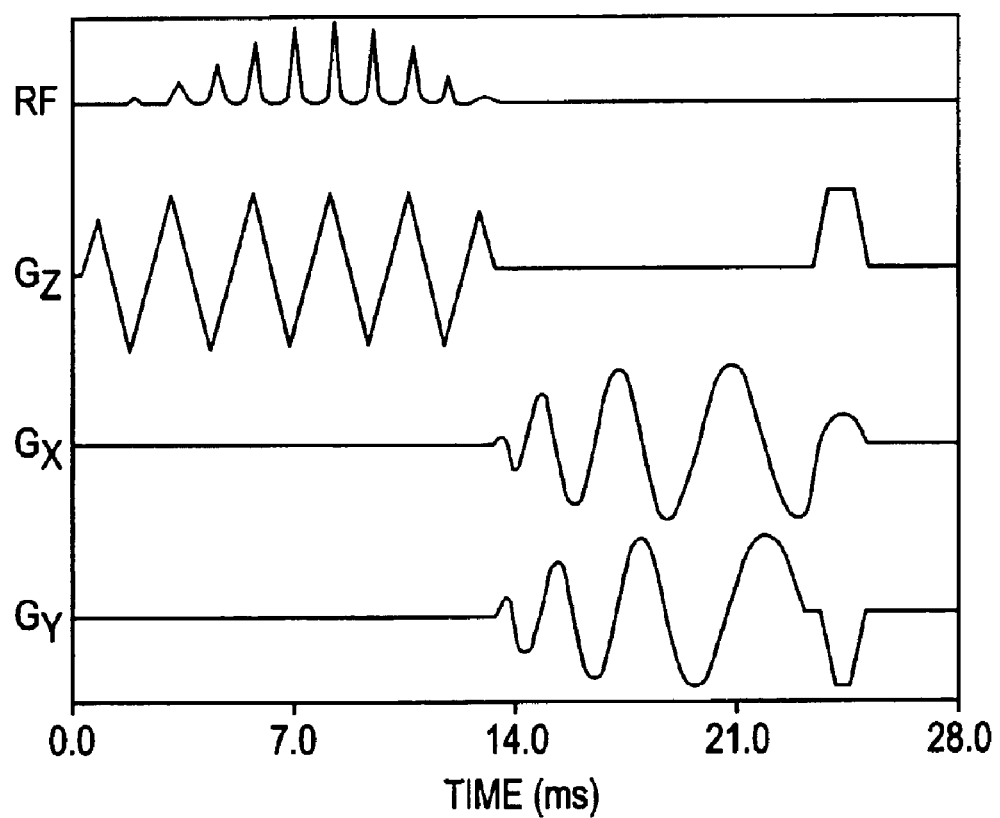
FIG. 6 illustrates a fluoroscopic basic pulse sequence for the MRI imaging apparatus of FIG. 5.

The NMR apparatus of FIG. 5 may be configured for real time (fluoroscopic) MRI imaging using interleaved, spiral k-space scanning. FIG. 6 illustrates a puse sequence for spiral fluoroscopic imaging. An RF excitation pulse is applied in the presence of a magnetic gradient Gz (assuming that the static magnetic field is along the Z axis) for slice selection, and the signals emitted from the excited nuclei are read-out in the presence of the Gx and Gy magnetic gradients for k-space scanning. In the k-space read-out, the starting point is an interleaved spiral sequence with N interleaves and with gradients numerically optimized under gradient risetime and amplitude constraints, as disclosed by Meyer et al. "Fast Spiral Coronary Artery Imaging", *Magnetic Resonance in Medicine,* 28:202–213(1992). The simplest spiral fluoroscopy sequence just repetitively acquires the interleaves with a short time of reception (TR) and uses the N most recent interleaves to reconstruct the entire image.

Figure 7:
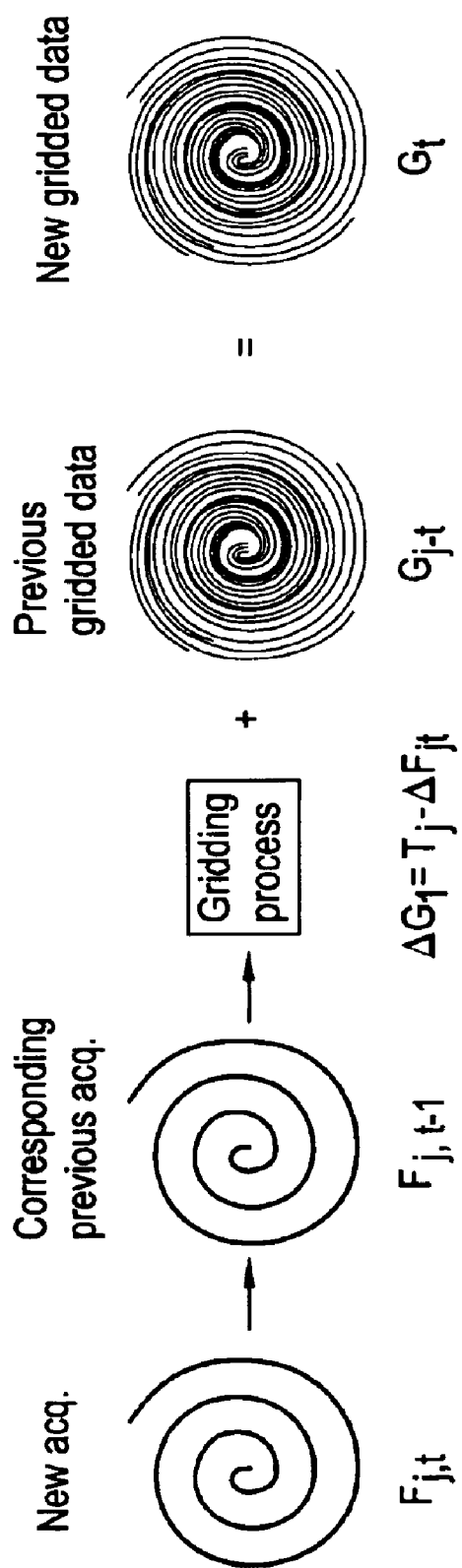
FIG. 7 is a schematic diagram of spiral k-space data reconstructed using the system of FIG. 5.

In this example, each partial data set $F_j$ comprises one or more spiral interleafs, and each frame G comprises multiple interleaves, as shown in FIG. 7. In the method of the present invention, the difference between the newly acquired partial data set (e.g., the newly acquired spiral interleaves) $F_{j,t}$ and the previously acquired partial data set (e.g., the previously acquired spiral interleaves) at a set of k-space positions j, is determined. The difference is then gridded to create a difference matrix $\Delta G_t$, and the difference matrix is added to a frame of previously gridded data $G_{t-1}$ to create a new frame $G_t$. The new frame is then transformed to create the image.

Because the new frame is regridded using only the difference between the old spiral interleaf and the new spiral interleaf, the present invention reduces the gridding time by a proportion of the number of shared acquisitions and the complete data set. Thus, the present invention improves the performance of the medical imaging system.

As previously noted, the present invention can be implemented in hardware (e.g., as a circuit, a digital signal processor chip, an application specific integrated circuit, or the like). The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for reconstructing non-uniformly sampled data to create an image, the method comprising:

receiving a new partial data set, said new partial data set including a vector of non-uniformly sampled data at k-space positions;

subtracting an old partial data set at said k-space positions from said new partial data set to create a difference vector;

gridding said difference vector to create a difference matrix;

adding said difference matrix to a frame of previously gridded data to create a new frame; and transforming said new frame to create the image.

2. The method of claim 1, wherein said gridding includes:

before said receiving, constructing a gridding table for a data point in a complete data set, said gridding table including a window function, a density compensation function, and a comb function; and convolving a data point in said difference vector with said gridding table.

3. The method of claim 2, further comprising:

receiving input parameters for at least one of aliasing energy and computation time; and optimizing at least one of a grid size and a first parameter of said window function using said input parameters.

4. The method of claim 3, wherein optimizing said at least one of said grid size and said first parameter of said window function includes:

selecting a first relationship between calculation time, grid size, and said first parameter of said window function;

selecting a second relationship between aliasing energy, grid size, and said first parameter of said window function; and applying said input parameters to said first and second relationships to determine said at least one of said grid size and said first parameter of said window function.

5. The method of claim 4, wherein:

said window function is a Kaiser-Bessel window; and said first parameter of said window function is a window width.

6. The method of claim 5, wherein optimizing said at least one of said grid size and said first parameter of said window function further includes:

applying said grid size and said window width to determine a shape parameter of said Kaiser-Bessel window.

7. The method of claim 1, wherein said transforming includes:
applying an FFTW algorithm.

8. An apparatus for reconstructing non-uniformly sampled data to create an image, the apparatus comprising:
a first buffer configured to store a newly acquire partial data set, said newly acquired partial data set including a vector of non-uniformly sampled data at k-space positions, said first buffer being further configured to output a previously acquired partial data set at said k-space positions;
a first summing device operably coupled to said first buffer, said first summing device being configured to subtract said previously acquired partial data set from said newly acquired partial data set to create a difference vector;
a gridding processor operably coupled to said first summing device, said gridding processor being configured to interpolate non-uniformly sampled data in said difference vector onto a uniformly spaced grid to create a difference matrix;
a second summing device operably coupled to said gridding processor, said second summing device being configured to add said difference matrix to a frame of previously gridded data to create a new frame of gridded data;
a second buffer operably coupled to said second summing device, said second buffer being configured to store said new frame of gridded data and output said frame of previously gridded data; and
a fast Fourier transform device operably coupled to said second summing device, said fast Fourier transform device being configured to transform said new frame to create the image.

9. The apparatus of claim 8, further comprising:
a gridding table constructor configured to constructing a gridding table for a data point in a complete data set, said gridding table including a window function, a density compensation function, and a comb function; and
a gridding table storage device operably coupled to said gridding table constructor and to said gridding device, said gridding table storage device being configured to store said gridding table; and
wherein said gridding device is further configured to retrieve said gridding table from said gridding table storage device, and convolve a data point in said difference vector with said gridding table.

10. The apparatus of claim 9, further comprising:
a grid parameter and size optimizer operably coupled to said gridding table constructor, said grid parameter and size optimizer being configured to:
receive input parameters for at least one of aliasing energy and computation time,
optimize a grid size and a first parameter of said window function using said input parameters, and
provide said grid size and said window function to said gridding table constructor.

11. The apparatus of claim 10, wherein said grid parameter and size optimizer is further configured to:
select a first relationship between calculation time, grid size, and said first parameter of said window function;
select a second relationship between aliasing energy, grid size, and said first parameter of said window function; and apply said input parameters to said first and second relationships to determine said grid size and said first parameter of said window function.

12. The apparatus of claim 10, wherein:
said window function is a Kaiser-Bessel window; and
said first parameter of said window function is a window width.

13. The apparatus of claim 12, wherein said grid parameter and size optimizer is further configured to apply said grid size and said window width to determine a shape parameter of said Kaiser-Bessel window.

14. The apparatus of claim 8, wherein said fast Fourier transform device is configured to apply an FFTW algorithm.

15. A storage medium encoded with machine-readable computer program code for reconstructing non-uniformly sampled data to create an image, the storage medium including instructions for causing a computer to implement a method comprising:
receiving a new partial data set, said new partial data set including a vector of non-uniformly sampled data at k-space positions;
subtracting an old partial data set at said k-space positions from said new partial data set to create a difference vector;
gridding said difference vector to create a difference matrix;
adding said difference matrix to a frame of previously gridded data to create a new frame; and
transforming said new frame to create the image.

16. The storage medium of claim 15, wherein said gridding includes:
before said receiving, constructing a gridding table for a data point in a complete data set, said gridding table including a window function, a density compensation function, and a comb function; and
convolving a data point in said difference vector with said gridding table.

17. The storage medium of claim 16, wherein said method further comprises:
receiving input parameters for at least one of aliasing energy and computation time; and
optimizing at least one of a grid size and a first parameter of said window function using said input parameters.

18. The storage medium of claim 17, wherein optimizing said at least one of said grid size and said first parameter of said window function includes:
selecting a first relationship between calculation time, grid size, and said first parameter of said window function;
selecting a second relationship between aliasing energy, grid size, and said first parameter of said window function; and
applying said input parameters to said first and second relationships to determine said at least one of said grid size and said first parameter of said window function.

19. The storage medium of claim 18, wherein:
said window function is a Kaiser-Bessel window; and
said first parameter of said window function is a window width.

20. The storage medium of claim 19, wherein optimizing said at least one of said grid size and said first parameter of said window function further includes:
applying said grid size and said window width to determine a shape parameter of said Kaiser-Bessel window.

21. The storage medium of claim 15, wherein said transforming includes:

applying an FFTW algorithm.

22. An apparatus for reconstructing non-uniformly sampled data to create an image, the apparatus comprising:

means for subtracting a previously acquired partial data set at k-space positions from a newly acquired partial data set at said k-space positions to create a difference vector;

means for interpolating non-uniformly sampled data in said difference vector onto a uniformly spaced grid to create a difference matrix;

means for adding said difference matrix to a frame of previously gridded data to create a new frame of gridded data; and means for transforming said new frame to create the image.

23. The apparatus of claim 22, further comprising:

means for constructing a gridding table for a data point in a complete data set, said gridding table including a window function, a density compensation function, and a comb function; and means for convolving a data point in said difference vector with said gridding table.

24. The apparatus of claim 23, further comprising:

means for optimizing a grid size and a parameter of said window function using input parameters for at least one of aliasing energy and computation time.

25. The apparatus of claim 22, wherein each of said means for subtracting, said means for interpolating, said means for adding, and said means for transforming include at least one of: a circuit, a digital signal processor chip, an application specific integrated circuit, and machine-readable code for use with a general purpose computer.

26. A medical imaging device including:

a computer; and a storage medium operably coupled to said computer, said storage medium encoded with machine-readable computer program code for reconstructing non-uniformly sampled data to create an image, the storage medium including instructions for causing a computer to implement a method comprising:

receiving a new partial data set, said new partial data set including a vector of non-uniformly sampled data at k-space positions;

subtracting an old partial data set at said k-space positions from said new partial data set to create a difference vector;

gridding said difference vector to create a difference matrix;

adding said difference matrix to a frame of previously gridded data to create a new frame; and transforming said new frame to create the image.

27. The medical imaging device of claim 26, wherein said gridding includes:

before said receiving, constructing a gridding table for a data point in said difference matrix, said gridding table including a window function, a density compensation function, and a comb function; and convolving a data point in said difference vector with said gridding table.

28. The medical imaging device of claim 26, wherein said method further comprises:

receiving input parameters for at least one of aliasing energy and computation time; and optimizing at least one of a grid size and a first parameter of said window function using said input parameters.

* * * * *